(12) United States Patent
Huss et al.

(10) Patent No.: US 10,153,774 B1
(45) Date of Patent: Dec. 11, 2018

(54) TRANSCONDUCTOR CIRCUIT FOR A FOURTH ORDER PLL

(71) Applicant: Cadence Design Systems, Inc., San Jose, CA (US)

(72) Inventors: Scott David Huss, Cary, NC (US); Mark Alan Summers, Cary, NC (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/418,327

(22) Filed: Jan. 27, 2017

(51) Int. Cl.
 *H03L 7/06* (2006.01)
 *H03L 7/093* (2006.01)
 *H03F 3/45* (2006.01)

(52) U.S. Cl.
 CPC ......... *H03L 7/093* (2013.01); *H03F 3/45273* (2013.01); *H03F 2200/129* (2013.01); *H03F 2203/45286* (2013.01)

(58) Field of Classification Search
 CPC ........... H03F 3/45273; H03F 2200/129; H03F 2203/45286; H03G 1/0035; H03G 1/0041; H03L 7/0898; H03L 7/093; H03L 7/099; H03L 7/0995; H03L 7/1976; H03L 2207/06
 USPC ....................................................... 327/156
 See application file for complete search history.

(56) References Cited

U.S. PATENT DOCUMENTS

| | | | | |
|---|---|---|---|---|
| 7,449,871 B2* | 11/2008 | Talbot | ...................... | G05F 3/242 323/312 |
| 7,489,181 B2* | 2/2009 | Pastorina | ................ | G05F 3/262 326/37 |
| 8,692,534 B2* | 4/2014 | Trochut | .............. | H02M 3/1588 323/271 |
| 2004/0080342 A1* | 4/2004 | Murakami | ............ | H03L 7/0802 327/8 |
| 2010/0026406 A1* | 2/2010 | Fujiwara | ................. | H03L 7/087 331/36 R |
| 2013/0049865 A1* | 2/2013 | Kawai | .................. | H03G 1/0035 330/254 |
| 2013/0120051 A1* | 5/2013 | Pu | ............................ | G11C 7/22 327/513 |

OTHER PUBLICATIONS

Williams, et al., "An Improved CMOS Ring Oscillator PLL with Less than 4ps RMS Accumulated Jitter", Custom Integrated Circuits Conference, Oct. 6, 2004, Proceedings of the IEEE 2004, 8-4-1 to 8-4-4, pp. 151-154.

* cited by examiner

*Primary Examiner* — Patrick Chen
(74) *Attorney, Agent, or Firm* — Hunton Andrews Kurth LLP

(57) ABSTRACT

A phase locked loop (PLL) circuit and a method for providing a transconductance in the PLL involve forming an input voltage to an operational amplifier by a loop filter. A voltage output of the operational amplifier controls a plurality of current mirrors. A current is formed through a first one of the current mirrors as a function of the input voltage, a resistance of a resistor, and a reference voltage. The reference voltage is directly provided by, or derived from, a reference signal. A second voltage formed in the first current mirror is fed back to the operational amplifier to maintain the current through the first current mirror, which current is then mirrored into at least a second one of the current mirrors to form an output current proportional to a difference between the input voltage and the reference voltage.

14 Claims, 5 Drawing Sheets

TRANSCONDUCTOR CIRCUIT FOR A FOURTH ORDER PLL

FIELD OF THE INVENTION

The present invention relates to phase locked loop circuits that include transconductors for controlling an oscillator in the phased locked loop circuit.

BACKGROUND

The order of a phase locked loop (PLL) circuit corresponds to the number of poles in the transfer function of the PLL, or the number of integrating elements in the PLL. A simple first order PLL includes a voltage controlled oscillator (VCO) as an integrating element. The VCO performs an integration of a control voltage supplied by a phase detector through a forward path, and provides an output signal to the phase detector through a feedback path. Second and higher order PLLs include a loop filter in addition to a VCO. In general, higher order PLLs are more stable, but more complex and slower, than lower order PLLs. Most PLLs use a third order architecture without a transconductor. Some fourth order PLLs use an open loop, source degenerated amplifier for the transconductor. Such fourth order PLLs have headroom issues for both the input and the output of the PLL. Additionally, the transconductance is highly dependent on the input device providing the input to the PLL.

DETAILED DESCRIPTION

The present disclosure provides non-limiting representative examples referencing numerals to particularly describe features and teachings of different aspects of the invention. The described embodiments should be recognized as capable of implementation separately or in combination with each other. A person of ordinary skill in the art reviewing the present disclosure should be able to learn and understand the different described aspects of the invention. The described embodiments should facilitate understanding of the invention to such an extent that other implementations not specifically covered, but within the knowledge of a person of ordinary skill in the art having read the present disclosure, would be understood to be consistent with an application of the invention.

Embodiments of the present disclosure relate to transconductor circuits for a fourth order PLL, but can be applied toward any PLL that uses a transconductor to control an oscillator. The embodiments provide for a transconductor with a wide input and output range. In particular, example transconductor circuits will be described which feature rail-to-rail input and output (e.g., VDD to ground), thus overcoming the headroom issues associated with conventional transconductor circuits used in fourth order PLLs.

Figure 1:
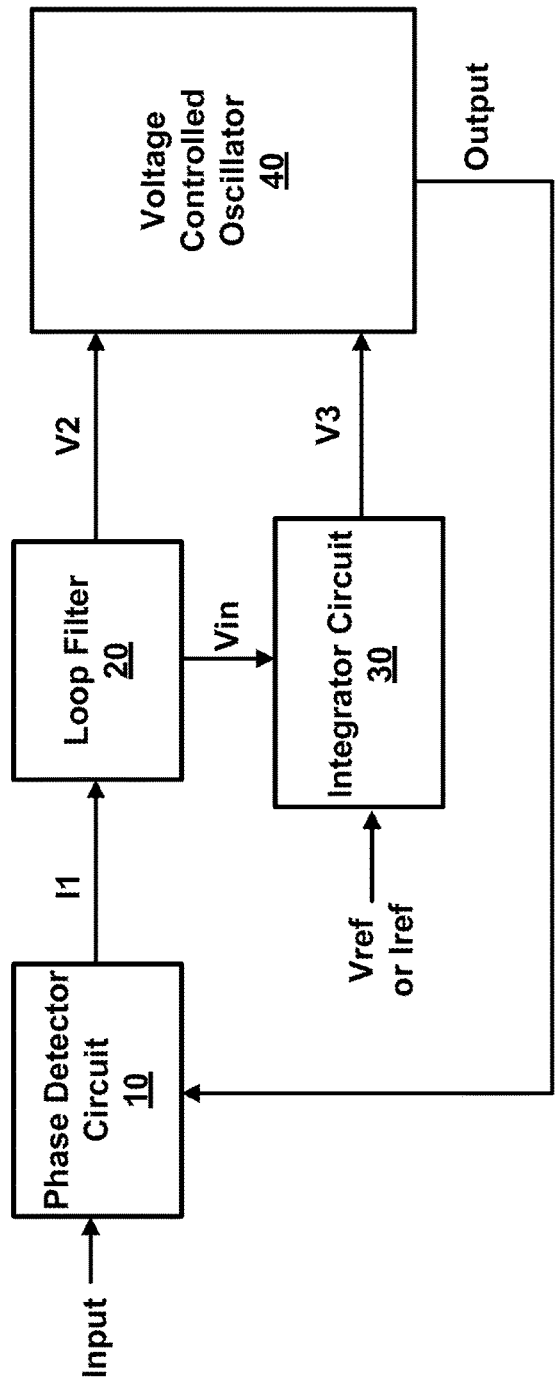
FIG. 1 is a block diagram of a PLL according to an embodiment of the present disclosure.

FIG. 1 is a block diagram of a PLL 100 according to an embodiment of the present disclosure. The PLL 100 includes a phase detector (PD) circuit 10, a loop filter 20, an integrator circuit 30, and a VCO 40. The PLL 100 may include additional elements not shown, such as a frequency divider in a feedback path connecting the output of the VCO 40 to an input of the PD 10.

The PD 10 receives an input signal, which has a particular frequency, as a first input. The PD 10 includes a circuit that performs phase-frequency detection. The PD 10 receives an output of the VCO 40 as a second input and generates a current "I1" representing the phase difference between the two inputs. The PD 10 forms the current I1 based on the results of the phase-frequency detection. The current I1 may be formed by the phase-frequency detection circuit itself. Alternatively, I1 may be formed by an additional circuit such as a charge pump located between PD 10 and the loop filter 20.

The loop filter 20 receives the current I1 and provides a corresponding voltage "V2" as a first control input to the VCO 40. The loop filter 20 derives V2 from I1. The loop filter 20 may include a network of at least one resistor and at least one capacitor that together form a frequency filter, for example, a low pass filter. The loop filter 20 provides an input voltage "Vin" to the integrator circuit 30. Vin can be generated by the same RC network that generates V2 and may, for example, represent a low pass filtered version of V2.

The integrator circuit 30 provides a transconductance "Gm" by forming a current "Iout" (an internal signal not shown in FIG. 1) based on Vin and a reference voltage "Vref". Specifically, the integrator circuit 30 implements the function Iout=Gm (Vin−Vref). The reference voltage Vref may be a temperature dependent voltage. Vref may be generated by a complementary to absolute temperature (CTAT) circuit to compensate for the temperature dependence of the VCO 40. The integrator circuit 30 circuit may include one or more operational amplifiers (op-amps) connected in a feedback loop to a current mirror that contributes to Iout. In one embodiment, a first op-amp is driven by Vin to control the current mirror, while a second op-amp driven by Vref is connected to the current mirror through a resistor and acts as a voltage follower buffer. In another embodiment, the voltage follower buffer and resistor are replaced by a Thevenin equivalent circuit that operates on a reference current "Iref" instead of a reference voltage. The integrator circuit 30 derives a voltage "V3" from the current Iout and outputs V3 to the VCO 40. V3 may be derived, for example, using a voltage-to-current converter with a capacitive load.

The VCO 40 generates an output signal having a frequency that varies as a function of V3 and V2. For example, the VCO frequency may be controlled by applying V2 and V3 to voltage controlled capacitors (varactors). The frequency of the output signal may, for example, be an integer or fractional multiple of the frequency of the input to the PLL. The output signal is fed back as the second input to the PD circuit 10 and, after the PLL has stabilized, has a phase matching that of the input to the PLL, that is, the first input of the PD circuit 10.

Figure 2:
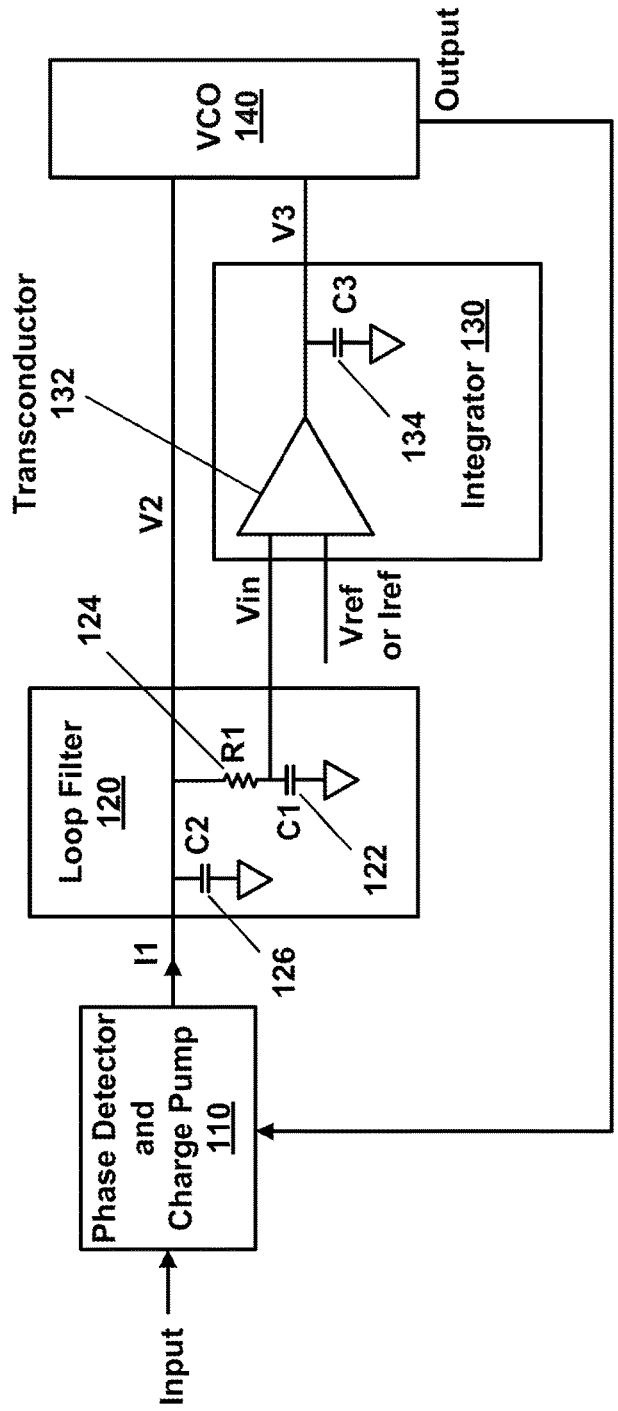
FIG. 2 is a block diagram of a specific implementation of the PLL in FIG. 1.

FIG. 2 is a block diagram of a specific implementation of the PLL in FIG. 1. FIG. 2 shows a PLL 101 that includes a phase detector 110, a loop filter 120, an integrator 130, and a VCO 140. The elements 110, 120, 130 and 140 respectively correspond to elements 10, 20, 30 and 40 in FIG. 1. The phase detector 110 is combined with a charge pump into a single circuit block.

Loop filter 120 includes at least one resistor and at least one capacitor, for example, a capacitor "C1" 122 in series with a resistor "R1" 124, with the series combination of C1 and R1 being connected to the output of the phase detector 110 in parallel with a second capacitor "C2" 126. The voltage V2 is the same as the voltage at the input of the loop filter 120, and is derived from I1. The loop filter 120 is a low pass filter that forms, at a node where R1 is connected to C1, the voltage Vin as a low pass filtered representation of V2.

Integrator 130 includes a transconductor circuit 132 and a capacitor "C3" 134. The transconductor circuit 132 outputs a current based on Vin and Vref, with capacitor C3 being connected to the output of the transconductor circuit 132 as an integrating element. The VCO 140 may be calibrated by applying Vref to outputs of the charge pump and the transconductor 132 so that Vref is formed as the VCO input voltages V2 and V3.

Figure 3:
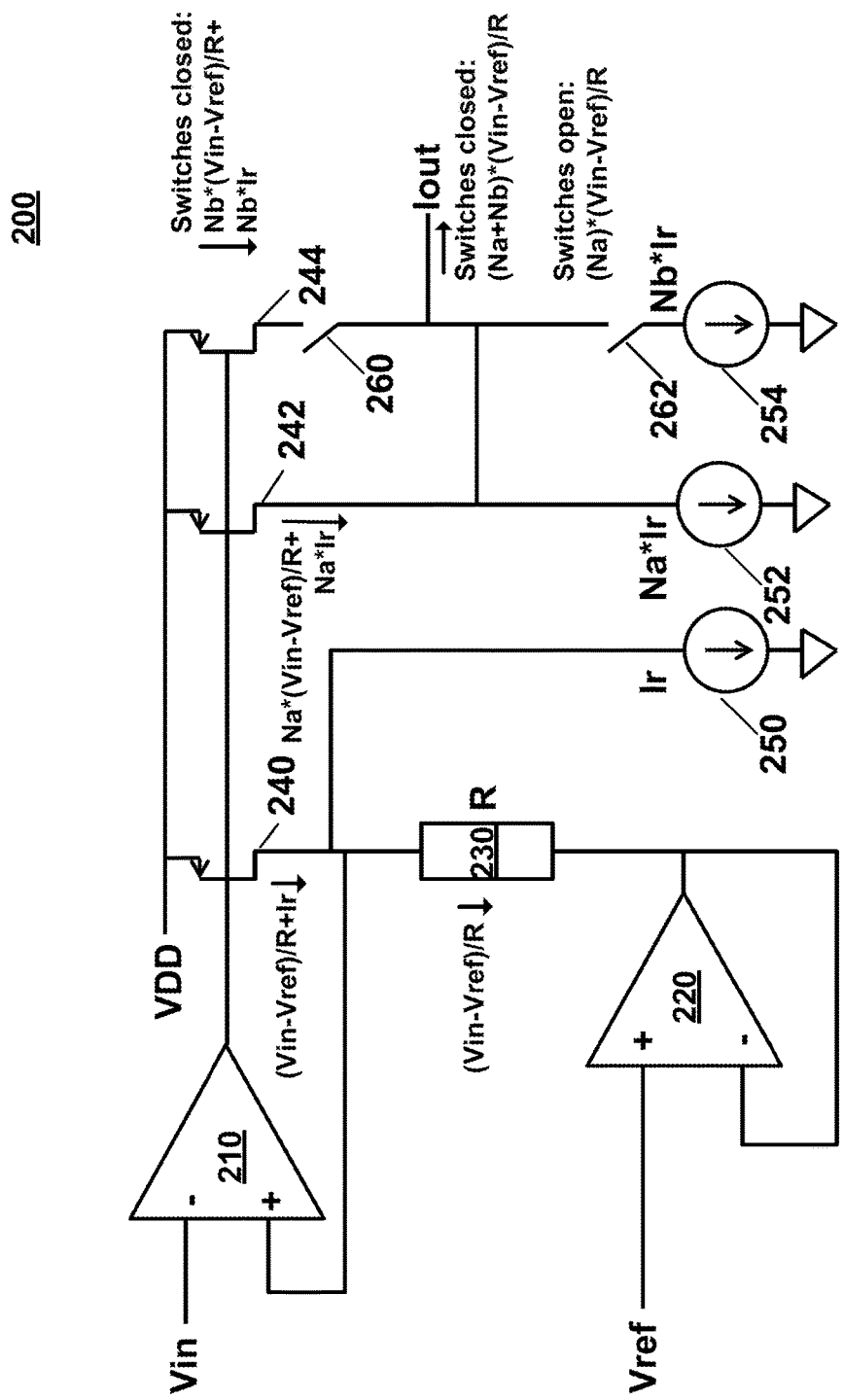
FIG. 3 is a simplified schematic of a transconductor circuit according to an embodiment of the present disclosure.

FIG. 3 is a simplified schematic of a transconductor circuit 200 according to an embodiment of the present disclosure. The circuit 200 includes a first op-amp 210, a second op-amp 220, a resistor 230, and a plurality of current mirrors. In the embodiment of FIG. 3, there are three current mirrors, each including a respective p-channel metal-oxide semiconductor (PMOS) transistor (240, 242, and 244). The source terminals of the PMOS transistors are connected to a positive supply rail (e.g., VDD) and the drain terminals are connected to a negative supply rail (e.g., ground) through respective current sources (250, 252 and 254). The PMOS transistors 240, 242 and 244 may be connected in a cascode configuration to other PMOS transistors (not shown). The current sources 250, 252, 254 are shown symbolically and may be implemented using n-channel metal-oxide semiconductor (NMOS) transistors that are also cascoded. Connections between the current sources 250, 252, 254 have been omitted from the drawings for simplicity. Cascoding minimizes the effect of mismatches between the drain-to-source voltage (VDS) of the PMOS transistors. As explained later, a current flowing through one current mirror can be mirrored into another current mirror, with at least one current mirror being directly connected to a node that forms Iout.

Op-amps amplify the difference between voltages applied at their inverting and non-inverting inputs. In the circuit 200, the op-amp 210 receives, at its inverting input, an input voltage Vin from a loop filter to output a voltage applied to the gates of PMOS transistors 240, 242 and 244. Op-amp 210 therefore controls all three current mirrors. However, as explained below, not all current mirrors need to be activated at any given time. When PMOS 240 is turned on by the output of op-amp 210, the current through PMOS 240 is equal to the sum of a current "Ir" produced by current source 250 and a current through resistor 230. The drain of PMOS 240 is connected to a first terminal of resistor 230 and is also connected in a feedback loop to a non-inverting input of op-amp 210. The resistor 230 has a resistance value "R". The op-amp 210 maintains a voltage equal to Vin at the drain terminal of PMOS 240. Since the source terminal of PMOS 240 is connected to a fixed supply voltage (e.g., VDD), the drain-to-source voltage VDS of PMOS 240 is maintained. Consequently, a voltage equal to Vin−Vref is maintained across resistor 230, so that PMOS 240 maintains a fixed current that is mirrored to the output of the circuit 200. The current mirrored to the output of the circuit 200 is fixed in the sense that it is a set function of Vin, Vref and R. It is not fixed like VDD, that is, in the sense of being held constant during the operation of the circuit 200, irrespective of Vin, Vref and R.

The op-amp 220 is configured as a voltage follower buffer and receives the reference voltage Vref at its non-inverting input. The closed loop gain of op-amp 220 is unity. The closed loop gain of the combination of op-amp 210 and PMOS 240 is also unity. The output of op-amp 220 is connected to a second terminal of resistor 230, opposite the terminal to which PMOS 240 and the op-amp 210 are connected. The output of op-amp 220 is also connected in a feedback loop to the inverting input of op-amp 220. As noted earlier, the voltage across resistor 230 is equal to Vin−Vref, so the current through PMOS 240 is Ir+(Vi−Vref)/R.

Each current mirror is configured to mirror its current into the next current mirror. Mirroring is performed in part by controlling PMOS transistors 240, 242 and 244 using the same gate-to-source voltage (VGS), supplied by op-amp 210. Further, if the current sources 250, 252 and 254 are implemented as NMOS transistors, the current through a first NMOS transistor can be mirrored into a second NMOS transistor using a conventional mirroring configuration, for example, by connecting the gates of the two NMOS transistors together and connecting the source of the first NMOS transistor to the shared gate.

The current mirrors are configured to provide successively increasing (in magnitude) contributions to Iout instead of one to one mirroring. In particular, the ratios of the currents provided by current sources 250, 252 and 254 are 1:Na:Nb, respectively. Na and Nb can be greater than or less than 1. The PMOS transistors 240, 242 and 244 are sufficiently matched to their respective current sources so that the ratios of the widths of the PMOS transistors are approximately the same as the ratios of the current sources, that is, 1:Na:Nb. Accordingly, the current through PMOS 242 is equal to Na*(Ir+(Vin−Vref)/R). The current in PMOS 242 contributes to the output current Iout through a permanent connection between an output node through which Iout flows and the drain of PMOS 242. PMOS 244 can be selectively connected to the output node using the switch 260. Switch 262 can selectively connect current source 254 to the output node. Switches 260 and 262 can be left open in a normal operating mode so that the output current is equal to Na(Vin−Vref)/R. Switches 260 and 262 can be closed in a fast lock mode to increase the transconductance. When switches 260 and 262 are closed, the current through PMOS 244 is equal to Nb*(Ir+(Vin−Vref)/R) and Iout is equal to (Na+Nb)(Vin−Vref)/R.

As mentioned earlier, the transconductor circuit 30 implements the function Iout=Gm (Vin−Vref). Thus, it will be apparent from the above expressions for Iout that the transconductance Gm is a function of the resistor 230. In particular, Gm equals Na/R when the switches 260 and 262 are open. When the switches are closed, Gm equals (Na+Nb)/R. Thus, Gm can be set by choosing an appropriate resistance value R. Gm is therefore insensitive to variations in transistor characteristics, so long as the metal-oxide semiconductor field-effect transistors (MOSFETS) are sized such that they remain in saturation over the required voltage range of Vin and they adequately match. The resistor 230 may be calibrated, for example, using a digital calibration code, to compensate for variations in the resistance value of the resistor. The calibration is generally done once, for example, when the transconductor circuit is manufactured, or each time the transconductor circuit is initialized.

Both op-amps 210 and 220 support rail-to-rail inputs, that is, Vin and Vref can vary from approximately VDD to approximately ground. A signal is considered rail-to-rail if it can get sufficiently close to each of the rails. In a MOSFET circuit, that generally means the signal can get within a saturation voltage (Vdsat, usually around 50 millivolts) of the rails. The output voltage of the op-amp 220 is also rail-to-rail. Consequently, the voltage at the node where output current Iout is formed (e.g., the voltage V3 in FIG. 1) is rail-to-rail and can support the range of values that may be needed by the VCO. As the gain of a VCO is often low and process dependent, the transconductor may need to have a wide output range. The circuit 200 provides such an output range.

Figure 4:
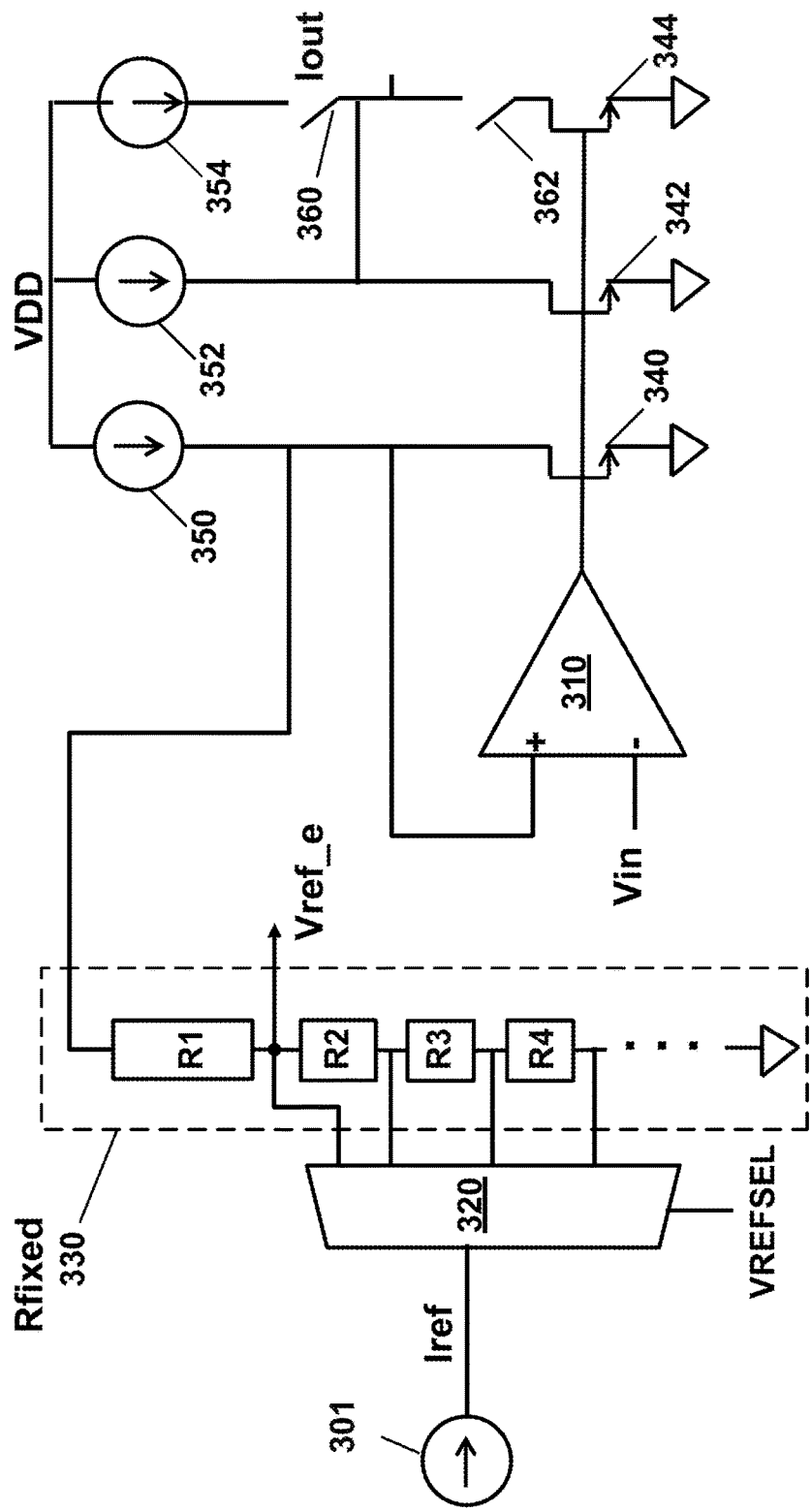
FIG. 4 is a simplified schematic of a transconductor circuit according to an embodiment of the present disclosure.

FIG. 4 is a simplified schematic of a transconductor circuit 300 according to an embodiment of the present disclosure. The circuit 300 is an alternative to the circuit 200 and provides a similar Iout function, but using a reference current Iref from a current source 301, instead of a reference voltage. The circuit 300 includes an op-amp 310, which is analogous to the op-amp 210 and which receives the input voltage Vin from the loop filter. The circuit 300 further includes a multiplexer 320, a resistor ladder 330, and a set of current mirrors. The current mirrors are formed by elements that are complementary to those in FIG. 3, and the relative sizes of the elements in the current mirrors are the same as in FIG. 3. Specifically, a first current mirror is formed by a PMOS current source 350 in series with an NMOS transistor 340, a second current mirror is formed by a PMOS current source 352 in series with an NMOS transistor 342, and a third current mirror is formed by a PMOS current source 354 in series with an NMOS transistor 344.

The resistor ladder 330 includes a plurality of resistors, e.g., R1 to R4. The effective resistance "Rfixed" of the resistor ladder is the total series resistance of the individual resistors in the ladder, e.g., R1+R2+R3+R4, and is independent of which output of the multiplexer 320 is selected. The reference current Iref may be a CTAT current. Iref is chosen as complementary to temperature for the same reason that Vref is CTAT, namely to cancel out temperature induced variations in the output of the VCO. The multiplexer 320 applies Iref to a selected point in the resistor ladder 330 such that the resistor ladder forms a Thevenin equivalent to applying Vref to the resistor 230 in FIG. 3. The Thevenin equivalent comprises a variable voltage source "Vref_e" and a fixed output resistance, that is, Rfixed.

Applying Iref to a selected point in the ladder generates Vref_e as an effective reference voltage, where Vref_e is equal to Iref multiplied by the series resistance between the point where Iref is applied and ground. For example, if the selected point is between R1 and R2, as shown in FIG. 4, Vref_e would equal Iref*(R2+R3+R4). The selection by the multiplexer may be controlled using an input "VREFSEL". If the switches are open, the transconductance Gm would, in this case, be equal to Na/Rfixed, and Iout would equal Gm*(Vin−Vref_e). Na is the ratio of NMOS 342 to 340, and also the ratio of current source 352 to 350. If the switches are closed, Gm would equal (Na+Nb)/Rfixed. Nb is the ratio of NMOS 344 to 340, and also the ratio of current source 354 to 350.

Vref_e can be used to calibrate a VCO, similar to the earlier described calibration in which Vref is applied to the V2 and V3 inputs of the VCO 40 in FIG. 1. Calibration can be performed during a calibration mode in which the op-amp 310, the current sources 350, 352 and 354, and the NMOS transistors 340, 342 and 344 are all disabled. In the calibration mode, an additional switch (not shown) could connect the point in the ladder corresponding to Vref_e to the voltage inputs of the VCO. Since the VCO is high impedance, no current flows in any resistors that are not between the output of the multiplexer and ground. For example, no current would flow through R1, and current would instead flow from the multiplexer through R2, R3 and R4 to ground. This is not the case when the circuit 300 is operational, for example, in the normal mode or the fast lock mode, so Vref_e cannot be directly measured in normal or fast lock mode.

When the circuit 300 is operational, the resistor ladder 330 provides a current that is combined with the current supplied by current source 350 to form the current in NMOS 340. The voltage at the node where resistor ladder 330 is connected to NMOS 340 and current source 350 is applied to the non-inverting input of op-amp 310. The output of the op-amp 310 controls the gates of the NMOS transistors 340, 342, 344 so that the output current Iout is formed in a similar manner to the formation of Iout in FIG. 3. Switch 360 selectively connects current source 354 to Iout. Switch 362 selectively connects NMOS 344 to Iout. The switch states for the normal and fast lock modes are the same as described earlier in connection with FIG. 3.

Although the circuit 300 could be implemented with NMOS current sources and an op-amp that drives PMOS devices like in FIG. 3, there is an advantage to driving NMOS devices instead. If Vin gets too low, the output of op-amp 310 (or the op-amp 210 in the circuit of FIG. 2) will increase substantially, producing a large increase in Iout. Vin is usually closer to VDD than ground. Therefore, a large increase in current is less likely to happen when the op-amp drives NMOS devices, which are turned on by voltages closer to VDD, than with PMOS devices, which are turned on by voltages closer to ground. The circuit of FIG. 3 may therefore be preferable over the circuit of FIG. 2 in certain applications, for example when dealing with Vin signals that have frequent and/or large voltage swings. The elimination of one op-amp is also an advantage in terms of power consumption.

Figure 5:
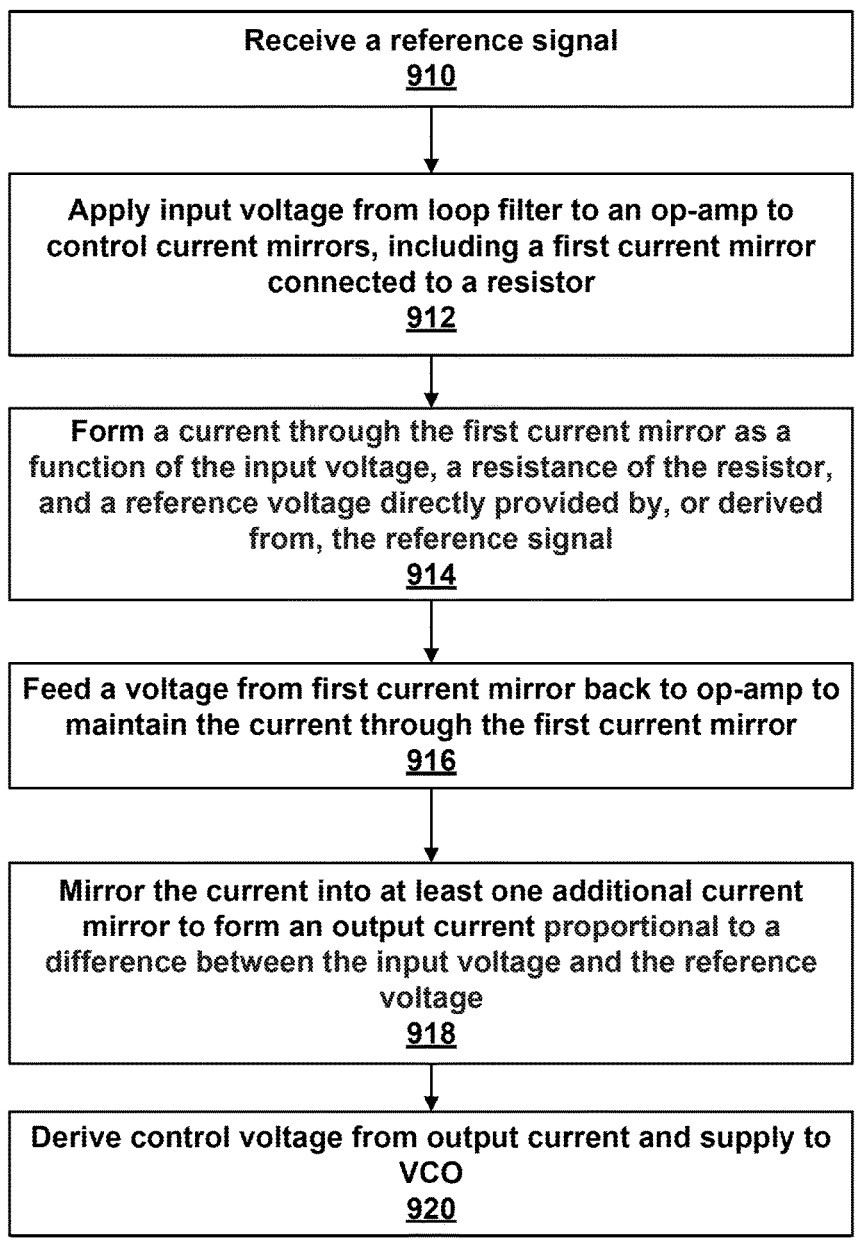
FIG. 5 is a flowchart of a method for generating an output current using a transconductor circuit according to an embodiment of the present disclosure.

FIG. 5 is a flowchart of a method 400 for generating an output current using a transconductor circuit according to an embodiment of the present disclosure. The method may be performed, for example, using the circuit 200 or the circuit 300 depending on whether the reference signal to the transconductor circuit provides a current or a voltage. Steps are shown which apply to both scenarios.

In step 910, the transconductor circuit receives a reference signal. The reference signal may be generated internally within the transconductor circuit or provided by an external reference source.

In step 912, the input voltage from the loop filter is applied to an op-amp to form a voltage that controls a set of current mirrors to which the output of the op-amp is connected. A first current mirror is connected to a resistor and also connected to the op-amp in a feedback loop.

In step 914, a current is formed through the first current mirror as a function of the input voltage, a resistance of the resistor, and a reference voltage directly provided by, or derived from, the reference signal. For example, if Vref is provided, the circuit of FIG. 3 may be used to form the current. Alternatively, if Iref is provided, the circuit of FIG. 4 may be used to form the current.

In step 916, a voltage formed in the first current mirror is fed back to the op-amp to maintain the current flowing through the first current mirror.

In step 918, the current through the first current mirror is mirrored into at least one additional current mirror to form an output current proportional to a difference between the input voltage and the reference voltage. The number of current mirrors used to form the output current may depend on the operating mode. For example, in the circuit 200, the second and third current mirrors are both activated during fast lock mode, but the third current mirror (244, 254) is not activated during normal mode. The current mirrors that are selectively activated can be controlled using switches to connect the current mirrors to a node where the output current is formed. Thus, the first current mirror's contribution to Iout is directly mirrored into one of the additional current mirrors, which may in turn mirror its own current into a subsequent current mirror, and at least one of the additional current mirrors is directly connected to the output current node.

In step 920, a control voltage is derived from the output current and supplied to a control input of a VCO.

The description of the foregoing embodiments may refer to algorithms, sequences, and operations that require processor execution of program instructions stored in memory. Memory may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, magnetic or optical cards, or any other type of media capable of storing program instructions.

In the foregoing description, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this description, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for providing a transconductance in a phase locked loop circuit, comprising:
   receiving an input voltage and a reference signal, wherein the input voltage is formed in a loop filter in the phase locked loop circuit;
   inputting the input voltage to an operational amplifier to form a first voltage that controls a plurality of current mirrors;
   forming a current through a first one of the plurality of current mirrors as a function of the input voltage, a resistance of a resistor, and a reference voltage directly provided by, or derived from, the reference signal;
   feeding a second voltage formed in the first current mirror back to the operational amplifier such that the current through the first current mirror is maintained;
   mirroring the current through the first current mirror into at least a second one of the plurality of current mirrors to form an output current proportional to a difference between the input voltage and the reference voltage,
   wherein, in a normal operating mode, one of the plurality of current mirrors is not activated; and
   in a fast lock mode, increasing a transconductance relative to the normal operating mode by activating the one of the plurality of current mirrors that is not activated.

2. The method of claim 1, wherein the reference signal directly provides the reference voltage, and wherein the reference voltage is temperature dependent.

3. The method of claim 1, further comprising:
   inputting the reference voltage to a second operational amplifier, wherein an output of the second operational amplifier is connected to the resistor.

4. The method of claim 3, wherein the second operational amplifier is configured as a voltage follower buffer, with the output of the second operational amplifier being connected in a feedback loop to an inverting input of the second operational amplifier.

5. The method of claim 1, wherein at least one of the plurality of current mirrors includes a current source connected in series with at least one transistor that is selectively turned on by the first voltage.

6. The method of claim 5, wherein each at least one transistor includes a metal-oxide semiconductor (MOS) transistor of complementary type to a MOS transistor in the current source to which the at least one transistor is connected in series.

7. The method of claim 1, wherein the plurality of current mirrors provide successively increasing contributions to the output current.

8. A phase locked loop circuit, comprising:
   a phase detector configured to form a phase difference signal representing a phase difference between an input signal and an output signal;
   a loop filter configured to form an input voltage by filtering the phase difference signal;
   a transconductor circuit including:
     a plurality of current mirrors;
     an operational amplifier into which the input voltage is input, wherein the operational amplifier forms a first voltage that controls the plurality of current mirrors; and
     a resistor connected to a first one of the plurality of current mirrors, wherein:
       the transconductor circuit is configured to form a current through the first current mirror as a function of the input voltage, a resistance of the resistor, and a reference voltage directly provided by, or derived from, a reference signal;
       the current through the first current mirror is maintained by feeding a second voltage formed in the first current mirror back to the operational amplifier;
       the current through the first current mirror is mirrored into at least a second one of the plurality of current mirrors to form an output current proportional to a difference between the input voltage and the reference voltage;
       one of the plurality of current mirrors is not activated in a normal operating mode of the phase locked loop circuit; and
       in a fast lock mode, a transconductance of the transconductor circuit is increased relative to the normal operating mode by activating the one of the plurality of current mirrors that is not activated; and a voltage controlled oscillator configured to form the output signal based on a voltage derived from the output current.

9. The phase locked loop circuit of claim 8, wherein the reference signal directly provides the reference voltage, and wherein the reference voltage is temperature dependent.

10. The phase locked loop circuit of claim 8, wherein the transconductor circuit includes a second operational amplifier into which the reference voltage is input, and wherein an output of the second operational amplifier is connected to the resistor.

11. The phase locked loop circuit of claim 10, wherein the second operational amplifier is configured as a voltage follower buffer, with the output of the second operational amplifier being connected in a feedback loop to an inverting input of the second operational amplifier.

12. The phase locked loop circuit of claim 8, wherein at least one of the plurality of current mirrors includes a current source connected in series with at least one transistor that is selectively turned on by the first voltage.

13. The phase locked loop circuit of claim 12, wherein each at least one transistor includes a metal-oxide semiconductor (MOS) transistor of complementary type to a MOS transistor in the current source to which the at least one transistor is connected in series.

14. The phase locked loop circuit of claim 8, wherein the plurality of current mirrors provide successively increasing contributions to the output current.

* * * * *